(12) United States Patent
Hirose

(10) Patent No.: US 9,553,575 B2
(45) Date of Patent: Jan. 24, 2017

(54) SEMICONDUCTOR DEVICE

(71) Applicant: Satoshi Hirose, Seto (JP)

(72) Inventor: Satoshi Hirose, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/436,767

(22) PCT Filed: Dec. 21, 2012

(86) PCT No.: PCT/JP2012/083346
§ 371 (c)(1),
(2) Date: Apr. 17, 2015

(87) PCT Pub. No.: WO2014/097488
PCT Pub. Date: Jun. 26, 2014

(65) Prior Publication Data
US 2015/0288357 A1    Oct. 8, 2015

(51) Int. Cl.
*H03K 17/567* (2006.01)
*H01L 23/528* (2006.01)
*H01L 29/423* (2006.01)

(52) U.S. Cl.
CPC ........... *H03K 17/567* (2013.01); *H01L 23/528* (2013.01); *H01L 29/4232* (2013.01); *H01L 2224/48091* (2013.01); *H01L 2224/49175* (2013.01)

(58) Field of Classification Search
CPC ................. H01L 2224/00; H01L 2224/48091; H01L 2224/49175; H01L 23/00; H01L 23/528; H01L 29/00; H01L 29/4232; H01L 2924/00; H01L 2924/00014; H03K 17/00; H03K 17/567
USPC ......................................................... 327/432
See application file for complete search history.

(56) References Cited

U.S. PATENT DOCUMENTS

2006/0202308 A1* 9/2006 Sugiyama ........... H01L 29/4232
257/566

FOREIGN PATENT DOCUMENTS

| JP | H05-211154 A | 8/1993 |
| JP | 2000-101076 A | 4/2000 |
| JP | 2008-305948 A | 12/2008 |
| JP | 2008-311523 A | 12/2008 |

* cited by examiner

*Primary Examiner* — John Poos
*Assistant Examiner* — David Mattison
(74) *Attorney, Agent, or Firm* — Oliff PLC

(57) ABSTRACT

Two or more pads and are connected to a gate region, so that a pad for applying a gate voltage can be selected. In the case where, for example, the peripheral region is likely to overheat, a turn-on voltage is applied to the first pad to turn on the peripheral region later than the central region, and a turn-off voltage is applied to the second pad to turn off the peripheral region earlier than the central region. The problem that the peripheral region is likely to overheat can be addressed. In the case where the flow of an excess current raises the temperature, the turn-off voltage is applied to the second pad. The problem that the temperature is likely to rise in the peripheral region when an excess current flows can be addressed.

10 Claims, 7 Drawing Sheets

FIG. 1

|    | First Pad | First Position | Second Position | Second Pad |
|----|-----------|----------------|-----------------|------------|
| 1a | Turn-on Voltage is Applied Thereto | Early Turn-on | Delayed Turn-on | |
| 1b | | Delayed Turn-on | Early Turn-on | Turn-on Voltage is Applied Thereto |
| 2a | Turn-off Voltage is Applied Thereto | Early Turn-off | Delayed Turn-off | |
| 2b | | Delayed Turn-off | Early Turn-off | Turn-off Voltage is Applied Thereto |

SEMICONDUCTOR DEVICE

TECHNICAL FIELD

The present specification discloses a semiconductor device including a gate region.

BACKGROUND ART

In known types of semiconductor device, adjusting voltage applied to the gate region changes resistance between the emitter region and the collector region or between the source region and the drain region. For example, in the case of an IGBT device, the application of voltage to the gate region reduces resistance between the emitter and the collector, resulting in current flowing between the emitter and the collector. In the case of a MOS device, the application of voltage to the gate region reduces resistance between the source and the drain, resulting in current flowing between the source and the drain. The gate region as used in the present specification may be referred to as a base region.

A semiconductor device of the types described above may be included in an inverter that controls current passing through a motor. Such an inverter includes a parallel circuit including series circuits connected in parallel, with each series circuit including an upper-row semiconductor device and a lower-row semiconductor device connected in series. In this case, an abnormality, for example, a short circuit of a coil in the motor, may result in an excess current flowing through the semiconductor devices. When the operation of the inverter is normal, an upper-row semiconductor device and a lower-row semiconductor device do not turn on simultaneously. If however, an abnormality that causes both of them to turn on simultaneously occurs, an excess current flows through the semiconductor devices.

If an abnormality of any kind occurs to cause an excess current to flow through a semiconductor device, the semiconductor device experiences a rise in temperature. There is a demand for a technique to protect a semiconductor device from overheating. In an attempt to meet the demand, techniques to protect a semiconductor device from overheating through heat dissipation or cooling have been developed, and a technique in Patent Document 1 has been developed.

The technique in Patent Document 1 joins a lead frame or a bus bar to a surface electrode formed on the surface of a semiconductor device. It is expected that such a structure allows heat produced in the semiconductor device to be transferred through the surface electrode to the lead frame or the like to thereby protect the semiconductor device from overheating.

CITATION LIST

Patent Document

Patent Document 1: JP 2008-305948 A

SUMMARY OF THE INVENTION

Problems to be Solved by the Invention

In some cases, a semiconductor device cannot be protected from overheating even with the technique in Patent Document 1. For example, due to a tolerance as to the alignment of the semiconductor device with the lead frame or the like, the distance to the lead frame or the like may be increased from a point in the peripheral region of the semiconductor device, and it may take time to transfer the heat produced in the point of the semiconductor device to the lead frame or the like. For this reason, an overheating phenomenon may occur in the peripheral region of the semiconductor device even with the technique in Patent Document 1.

There is also a known technique to protect a semiconductor device from overheating by turning off the semiconductor device when an excess current flowing through the semiconductor device is detected. Even through the combined use of this technique and the technique to transfer heat to a lead frame or the like, a semiconductor device cannot be protected from overheating in some cases. This is because an overheating phenomenon may occur in the semiconductor device in a time period from the detection of an excess current to the turning off of the semiconductor device. In particular, the peripheral region of the semiconductor device tends to experience an overheating phenomenon because it takes time to transfer the produced heat to the lead frame or the like as described above.

An example case has been described above where different phenomena occur in different regions within a semiconductor device. There are many other cases where different phenomena occur in different regions within a semiconductor device. For example, when a semiconductor device is operating normally, the temperature is more likely to rise in the central region of the semiconductor device than in the peripheral region. In other cases, a semiconductor device may have a region that is cooled with ease and a region that is cooled with difficulty in a manner dependent on the relationship to the flow of a coolant.

The present specification discloses a technique to solve a disadvantage caused in a specific region by different phenomena occurring in different regions within a semiconductor device.

Solutions to Problems

The present technique is to be applied to a semiconductor device including a gate region extending on a surface of its semiconductor substrate.

The gate region as used herein is a region formed on a part of the semiconductor substrate or a region added to the semiconductor substrate, and it is a region made with a semiconductor material having enhanced conductivity. Some semiconductor devices include a gate region extending on a surface of its semiconductor substrate in a plan view of the semiconductor substrate. For example, a known type of IGBT device includes gate regions extending linearly and disposed parallel over a large area on the substrate. This type of semiconductor device needs a gate wiring for transmitting voltage to be applied to the gate regions and also needs a pad connected to the gate wiring. Such a pad may be disposed on the surface of the semiconductor substrate. The pad and the gate wiring are made with metal materials. In the present application, a conductive component connected to the pad is referred to as a gate wiring if it is made with a metal material; a conductive component connected to the pad is referred to as a gate region if it is made with a semiconductor material having enhanced conductivity.

A semiconductor device disclosed in the present specification includes a gate region extending on a surface of its substrate and connected to gate wirings at two or more points in the gate region, with each gate wiring being connected to a unique pad. A point connecting the gate region and a first gate wiring is referred to as a first point, and a point connecting the gate region and a second gate wiring is referred to as a second point. The first point and the second point are located at different positions on the surface of the substrate.

The semiconductor device described above includes two or more pads (for example, a first pad and a second pad). This provides the capability to select a pad to which gate voltage is to be transmitted. A comparison between a gate wiring, which is made with a metal material, and a gate region, which is made with a semiconductor material, indicates that the gate-voltage transmission speed in the latter is lower than that in the former. The gate-voltage transmission speed being lower in the gate region results in a phenomenon where the gate voltage reaching timing is distributed in a manner dependent on positions within the semiconductor device.

For example, a point connecting the first gate wiring, which extends from the first pad, and the gate region is referred to as the first point, and a point connecting the second gate wiring, which extends from the second pad, and the gate region is referred to as the second point. The same gate region is connected to the first pad via the first point and also connected to the second pad via the second point.

Additionally, a position close to the first point and far from the second point is referred to as a first position, and a position far from the first point and close to the second point is referred to as a second position. Since the gate-voltage transmission speed is low in the gate region, phenomena described in FIG. 1 are caused by selecting a pad to which the gate voltage is to be applied.

(1*a*) The first pad is selected and a turn-on voltage is applied thereto. In this case, the turning on is early at the first position, which is close to the first point, and the turning on is delayed at the second position, which is far from the first point.

(1*b*) The second pad is selected and the turn-on voltage is applied thereto. In this case, the turning on is early at the second position, which is close to the second point, and the turning on is delayed at the first position, which is far from the second point.

(2*a*) The first pad is selected and a turn-off voltage is applied thereto. In this case, the turning off is early at the first position, which is close to the first point, and the turning off is delayed at the second position, which is far from the first point.

(2*b*) The second pad is selected and the turn-off voltage is applied thereto. In this case, the turning off is early at the second position, which is close to the second point, and the turning off is delayed at the first position, which is far from the second point.

The semiconductor device described above provides the capability to select a pad to which the gate voltage is to be applied and thereby to prevent a disadvantage from being caused in a specific region in the semiconductor device by different phenomena occurring in different regions in the semiconductor device.

For example, in the case where overheating is likely to occur at the second position, by transmitting the turn-on voltage to the first pad and transmitting the turn-off voltage to the second pad (i.e., by implementing "1*a* and 2*b*" in FIG. 1), the problem that overheating is likely to occur at the second position can be addressed. In the case where overheating is likely to occur at the first position, by transmitting the turn-on voltage to the second pad and transmitting the turn-off voltage to the first pad (i.e., by implementing "1*b* and 2*a*" in FIG. 1), the problem that overheating is likely to occur at the first position can be addressed.

With the capability to select a pad to which the gate voltage is to be applied from among two or more pads, various options are available to select from. For example, switching pads to which the gate voltage is to be applied, from one to be used for the application of the turn-on voltage to another to be used for the application of the turn-off voltage is effective in some cases. In other cases, switching pads to which the gate voltage is to be applied, from one to be used for a time period in which no excess current is detected to another to be used when an excess current flowing through the semiconductor device is detected is effective. In particular, switching pads for the application of the turn-off voltage may be effective.

By disposing the first point in a central region of the semiconductor substrate and disposing the second point in a peripheral region of the semiconductor substrate, the problem that the peripheral region is likely to overheat or, conversely, the problem that the central region is likely to overheat can be addressed.

If the peripheral region is likely to overheat, transmitting the turn-on voltage to the first pad and transmitting the turn-off voltage to the second pad is effective. More specifically, by implementing "1*a* and 2*b*" in FIG. 1, the phenomenon where the peripheral region, in which the second point is located, is likely to overheat can be addressed.

Although the gate-voltage transmission speed is slow in the gate region, the time difference between the turn-on timings at the first position and at the second position or the time difference between the turn-off timings at these positions are small. The fraction expressing the ratio of the time difference between the turn-on timings to one on-period, or the fraction expressing the ratio of the time difference between the turn-off timings to one off-period is small. Nevertheless, in the case where the technique to turn off a semiconductor device when an excess current flows through the semiconductor device and the technique to transfer heat to a lead frame or the like are used in combination to prevent overheating, transmitting the turn-off voltage to the second pad, with the first point located in the central region of the semiconductor substrate and the second point located in the peripheral region of the semiconductor substrate, is effective. The rate at which the temperature rises due to an excess current flowing through the semiconductor device is extremely high, and, thus, the transmission of the turn-off voltage to the second pad to advance the turn-off timing in the peripheral region is effective. In the case described above, the effect of preventing overheating is significant even though the time difference between the turn-off timing advanced through the transmission of the turn-off voltage to the second pad and the turn-off timing resulting from the transmission of the turn-off voltage to the first pad is small.

A technique to transmit the turn-off voltage to the first pad in a time period in which no excess current is flowing through the semiconductor device and to transmit the turn-off voltage to the second pad when an excess current flowing to the semiconductor device is detected is also effective.

In the time period in which no excess current is flowing through the semiconductor device, transmitting the turn-on voltage to the second pad and transmitting the turn-off voltage to the first pad is effective in some cases, and transmitting both of the turn-on voltage and the turn-off voltage to the first pad is effective in other cases. In any of the cases, the technique to transmit the turn-off voltage to the second pad when an excess current flowing through the semiconductor device is detected to thereby prevent the overheating is useful.

Effects of the Invention

The semiconductor device disclosed in the present specification provides the capability to select a pad to which the gate voltage is to be applied to thereby address a disadvantage that may be caused in a specific region by different phenomena occurring in different regions in the semiconductor device.

Specifically, with the first point, which connects the gate region and the first gate wiring, located in the central region of the substrate and the second point, which connects the gate region and the second gate wiring, located in the peripheral region of the substrate, a time difference can be set between the turn-on timing in the central region and the turn-on timing in the peripheral region, or a time difference can be set between the turn-off timing in the central region and the turn-off timing in the peripheral region. In this manner, a disadvantage that may be caused in the central region or in the peripheral region can be addressed.

By applying the turn-on voltage to the first pad and applying the turn-off voltage to the second pad, overheating in the peripheral region can be prevented even if the peripheral region is in an ambiance that promotes overheating. Moreover, when an excess current is generated, the production of heat can be suppressed in the peripheral region, which is likely to overheat due to an excess current. In this manner, the effect of protecting a semiconductor device from overheating can be provided.

By transmitting the turn-off voltage to the first pad in a time period in which no excess current is detected and transmitting the turn-off voltage to the second pad when an excess current is detected, the production of heat can be suppressed in the peripheral region, which is likely to overheat due to an excess current. In this manner, the effect of protecting the semiconductor device from overheating can be provided.

In the time period in which no excess current is detected, both of the turn-on voltage and the turn-off voltage may be transmitted to the first pad. In this manner, the on-period in the central region and the on-period in the peripheral region can be aligned in the time period in which no excess current is detected. Alternatively, the turn-on voltage may be applied to the second pad and the turn-off voltage may be applied to the first pad in the time period in which no excess current is detected. In the manner described above, overheating in the central region can be prevented if the central region is likely to overheat.

BRIEF DESCRIPTION OF DRAWINGS

FIG. 1 is a diagram for describing events caused by selecting a pad to which the gate voltage is to be applied.

MODE FOR CARRYING OUT THE INVENTION

The features of the embodiments to be explained hereinafter will be described first. As used below, a pad connected to a gate wiring having a point, which connects to a gate region, at the center of a semiconductor substrate is referred to as a first pad; a pad connected to a gate wiring having a point, which connects to the gate region, at the periphery of the semiconductor substrate is referred to as a second pad.

Feature 1: The first pad has been selected at the application timing of a turn-on signal, and the second pad has been selected at the application timing of a turn-off signal.

Feature 1A: While a gate voltage adjusting device is outputting a turn-on voltage, the second pad is connected to the gate voltage adjusting device, with the first pad left floating.

Feature 1B: While the gate voltage adjusting device is outputting a turn-off voltage, the first pad is connected to the gate voltage adjusting device, with the second pad left floating.

Feature 2: In a time period in which no excess current is detected, the second pad has been selected at the application timing of a turn-on signal, and the first pad has been selected at the application timing of a turn-off signal. When an excess current is detected, the second pad is selected.

Feature 2A: While the gate voltage adjusting device is outputting the turn-on voltage, the first pad is connected to the gate voltage adjusting device, with the second pad left floating.

Feature 2B: While the gate voltage adjusting device is outputting the turn-off voltage, the second pad is connected to the gate voltage adjusting device, with the first pad left floating.

Feature 3: In a time period in which no excess current is detected, the first pad is selected. When an excess current is detected, the second pad is selected.

Feature 3A: When an excess current is detected, the gate voltage adjusting device outputs the turn-off voltage.

Embodiment

Figure 2:
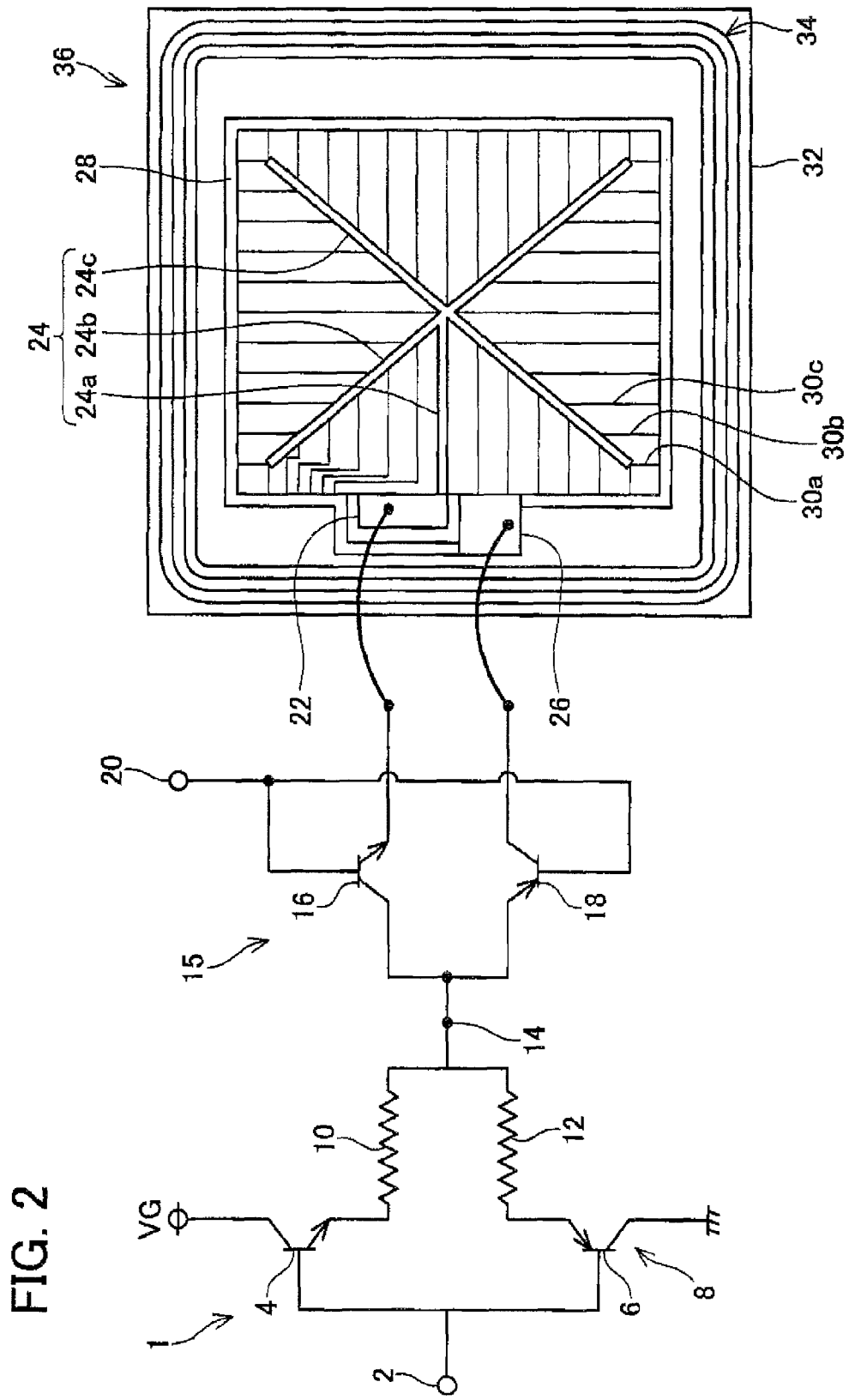
FIG. 2 is a schematic diagram illustrating a circuit configuration and a surface of a semiconductor substrate according to an embodiment.

In FIG. 2, a semiconductor device according to a first embodiment is indicated by the reference numeral 36. A first pad 22 and a second pad 26 are formed on a surface of a substrate 32. A first gate wiring 24 is connected to the first pad 22. The first gate wiring 24 is formed with a horizontal section 24a, which connects a central position of the substrate 32 and the first pad 22, and two diagonal sections 24b and 24c, which extend in diagonal directions of the substrate 32. A second gate wiring 28 is connected to the second pad 26. The second gate wiring 28 extends along the perimeter of the substrate 32. The reference numeral 34 indicates a guard ring for enhancing high voltage resistance of the semiconductor device at its peripheral region. The semiconductor device 36, which is an IGBT device, has IGBT structures formed in a region inside the guard ring 34. The second gate wiring 28 extends in a loop around the outside of the region in which IGBT cells are formed.

The reference numerals 30a, 30b, 30c, and so forth indicate gate regions. For clarity of the figure, only some of the gate regions are designated with the reference numerals, which are 30a, 30b, and 30c. Every thin line in the figure represents a gate region extending on the surface of the substrate 32.

The gate regions 30a, 30b, 30c, and so forth extend linearly on the surface of the substrate 32 and arranged in parallel with each other. For clarity of the figure, the gaps between adjacent gate regions are enlarged in FIG. 2. The actual gaps between the gate regions disposed in parallel are narrower. The gate regions 30a, 30b, 30c, and so forth extend widely in the region inside the guard ring 34 to form the IGBT cells over a large area in the region inside the guard ring 34.

Each gate region is connected to both of the first gate wiring 24 and the second gate wiring 28. For example, the gate region 30c is connected to the diagonal section 24c of the first gate wiring 24 and the second gate wiring 28. The gate regions are collectively referred to as a gate region 30 hereinafter. Since the second gate wiring 28 extends along the perimeter of the substrate 32, a second point connecting the gate region 30 and the second gate wiring 28 is located at a position along the perimeter of the substrate 32. In contrast, since the first gate wiring 24 is formed in an area surrounded by the second gate wiring 28, a first point connecting the gate region 30 and the first gate wiring 24 is located in a region at the inner side with respect to the second point. Such first points are distributed in a region 42 (see FIG. 3) located at the center of the substrate 32; such second points are distributed in a region 40 located at the periphery of the substrate 32.

Figure 3:
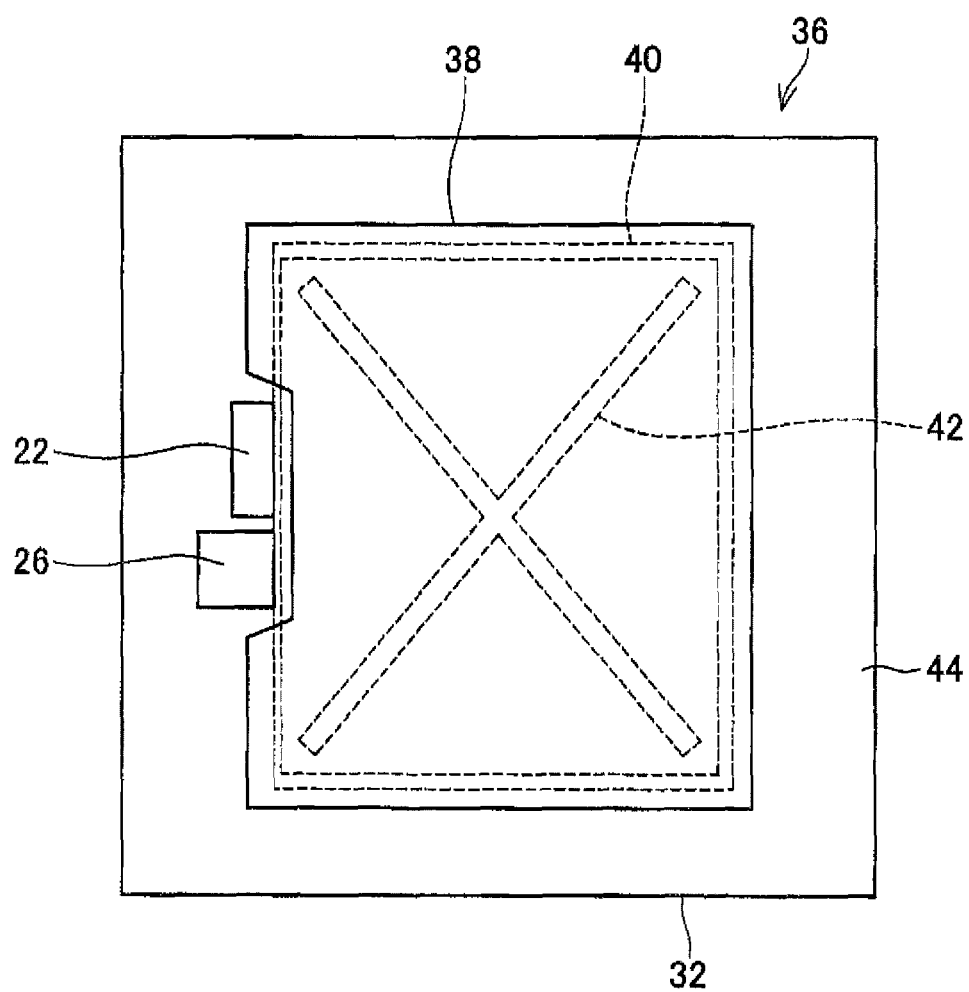
FIG. 3 is a schematic diagram illustrating a front side of the semiconductor device.

FIG. 2 illustrates an arrangement beneath a protective film formed on the surface of the semiconductor substrate 32. The surface of the semiconductor substrate 32 is actually covered with the protective film. FIG. 3 is a view observing the front side of the semiconductor device 36, with the semiconductor device 36 covered with a protective film 44 except the first pad 22 and the second pad 26. An emitter electrode 38 is formed on a surface of the protective film 44. The emitter electrode 38 is connected to an emitter region formed in the semiconductor substrate 32. The emitter electrode 38 is insulated from the gate region 30 by the protective film 44. An undepicted collector electrode is formed at the back side of the semiconductor substrate 32.

In FIG. 3, the region 42 where the first points are distributed and the region 40 where the second points are distributed are marked with the broken lines.

The semiconductor device 36 is put to use with the collector electrode at the back side soldered to another substrate, the emitter electrode 38 at the front side soldered to a bus bar, and the pads 22 and 26 connected to a gate voltage adjusting device. When an excess current flows through the semiconductor device 36 which in turn produces heat, the heat is primarily produced at the front side of the semiconductor substrate 32. A design consideration is given so that such heat is transferred through the emitter electrode 38 to the bus bar. However, in reality, due to a tolerance as to the alignment of the bus bar with the emitter electrode 38, a problem that it takes time to dissipate the heat is likely to occur in a peripheral region of the substrate 32, i.e., in proximity to the region 40 where the second points are distributed, because the distance to the bus bar may be long in this region. The time taken to dissipate the heat due to the long distance to the bus bar may have a significant influence because, in the case of the heat production resulting from the flow of an excess current, the rate at which the temperature rises is extremely high. The semiconductor device 36 according to the embodiment has a propensity to overheating in the peripheral region when an excess current flows therethrough.

This embodiment, which includes the two pads that transmit a gate voltage to the gate region 30, addresses the problems described above with its capability to select a pad for transmitting the gate voltage.

In FIG. 2, a terminal 2 indicates a terminal that receives signal voltage output by another device. The terminal 2 receives a high voltage during a time period in which the semiconductor device (the IGBT device) 36 is on, and a low voltage during a time period in which the semiconductor device 36 is off. When the terminal 2 receives the high voltage, a transistor 4 and a transistor 6 included in a cMOS circuit 8 are turned on and off, respectively, which increases the voltage at the position designated with the reference numeral 14 to a VG voltage. The increase rate is adjusted by an on-resistor 10. When the terminal 2 receives the low voltage, the transistor 4 and the transistor 6 included in the cMOS circuit 8 are turned off and on, respectively, which reduces the voltage at the position designated with the reference numeral 14 to a grounding voltage. The reduction rate is adjusted by an off-resistor 12. The cMOS circuit 8 or the like is included in a gate voltage adjusting device 1.

In this embodiment, a circuit 15 for selecting a pad to which the gate voltage output by the gate voltage adjusting device 1 is to be transmitted is disposed between the position designated with the reference numeral 14 and the first pad 22 and between the position designated with the reference numeral 14 and the second pad 26.

A terminal 20 receives a high voltage during a time period in which the first pad 22 is connected to the gate voltage adjusting device 1, with the second pad 26 left floating, and a low voltage during a time period in which the second pad 26 is connected to the gate voltage adjusting device 1, with the first pad 22 left floating. When the terminal 20 receives the high voltage, the transistor 16 is turned on and the transistor 18 is turned off, which causes the output voltage of the gate voltage adjusting device 1 to be input to the first pad 22, leaving the second pad 26 to float. When the terminal 20 receives the low voltage, the transistor 16 is turned off and the transistor 18 is turned on, which causes the output voltage of the gate voltage adjusting device 1 to be input to the second pad 26, leaving the first pad 22 to float.

Figure 4:
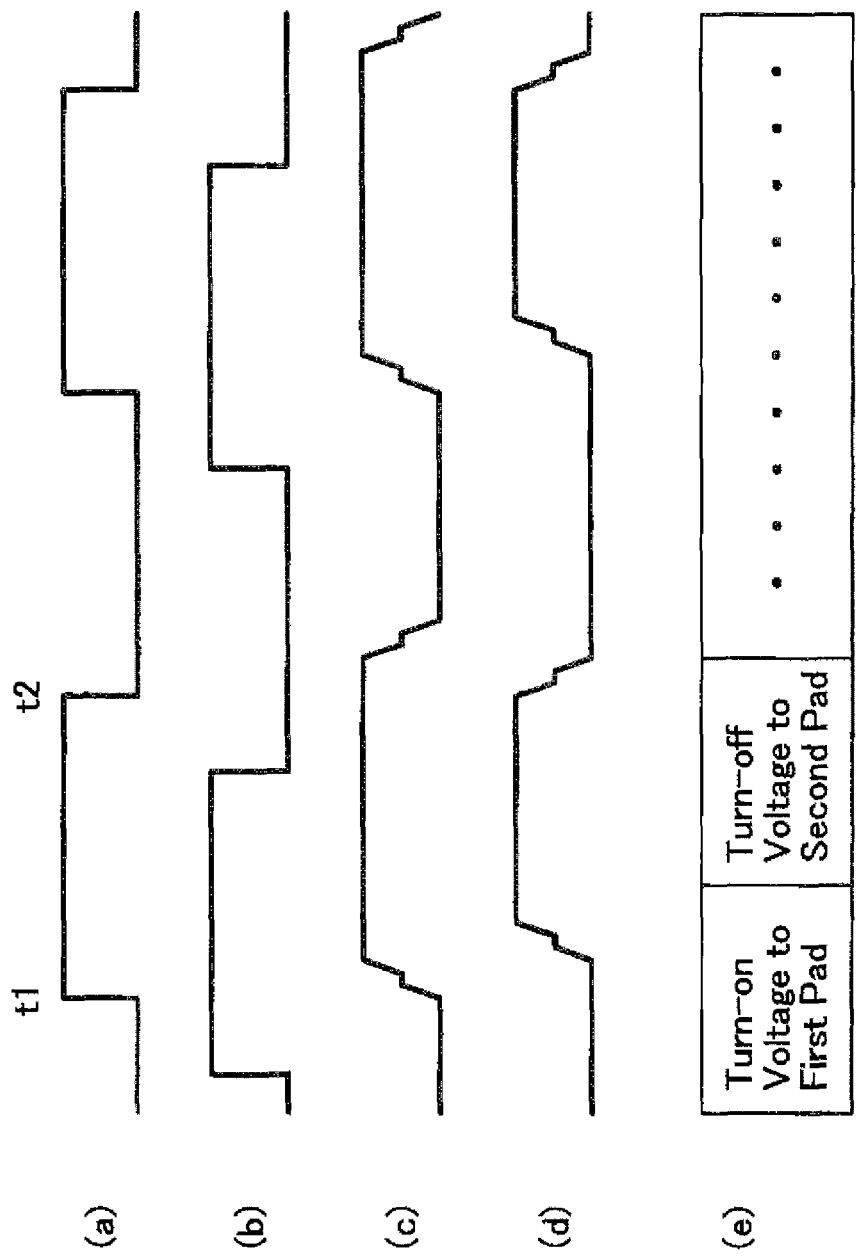
FIG. 4 is a diagram for describing a method of selecting pads according to a first embodiment and resultant events.

FIG. 4 (a) indicates example of input voltage to the terminal 2. FIG. 4 (b) indicates input voltage to the terminal 20. As the comparison between (a) and (b) clearly shows, there is a relationship adjusted so that the first pad 22 is selected, with the second pad 26 left floating, before a timing t1 at which a turn-on signal is input. Additionally, there is a relationship adjusted so that the second pad 26 is selected, with the first pad 22 left floating, before a timing t2 at which a turn-off signal is input. These relationships are summarized in (e).

The gate voltage at IGBT cells formed in the central region of the substrate 32 is indicated by (c);
the gate voltage at IGBT cells formed in the peripheral region of the substrate 32 is indicated by (d). Since the turn-on voltage is transmitted to the first pad 22, the IGBT cells formed in the central region are turned on early and the IGBT cells formed in the peripheral region are turned on with a delay. In contrast, since the turn-off voltage is transmitted to the second pad 26, the IGBT cells formed in the central region are turned off with a delay, and the IGBT cells formed in the peripheral region are turned off early. IGBT cells produce heat during the period in which they are on. The embodiment provides the capability to suppress the heat produced in the peripheral region and thereby to address the problem of overheating in the peripheral region.

In the embodiment described above, upon the detection of an excess current flowing through the semiconductor device 36, the terminal 2 receives the low voltage and the terminal 20 also receives the low voltage. As a result, the IGBT cells in the peripheral region are turned off first. The problem that the peripheral region is likely to overheat when an excess current flows can also be addressed.

As illustrated with FIG. 4 (b), the pad selecting circuit 15 switches the selection between the first pad 22 and the second pad 26 when the gate region 30 is stable with the high voltage applied thereto and when the gate region 30 is stable with the electric charge therein discharged. No disadvantage is caused during the switchover. This is similar in the embodiments to be described below.

In FIG. 4, the time difference between the turn-on timings in the central region and the peripheral region and the time difference between the turn-off timings in the central region and the peripheral region are enlarged. The actual time differences are so small that the longer on-period of the central region and the shorter off-period of the peripheral region do not have a practical influence on a phenomenon dependent on an average value over time. However, the time differences affect a transient event like a temperature rising phenomenon caused when an excess current flows. The problem that the peripheral region is likely to overheat due to an excess current is effectively addressed by the turning off in the peripheral region earlier than in the central region.

Figure 5:
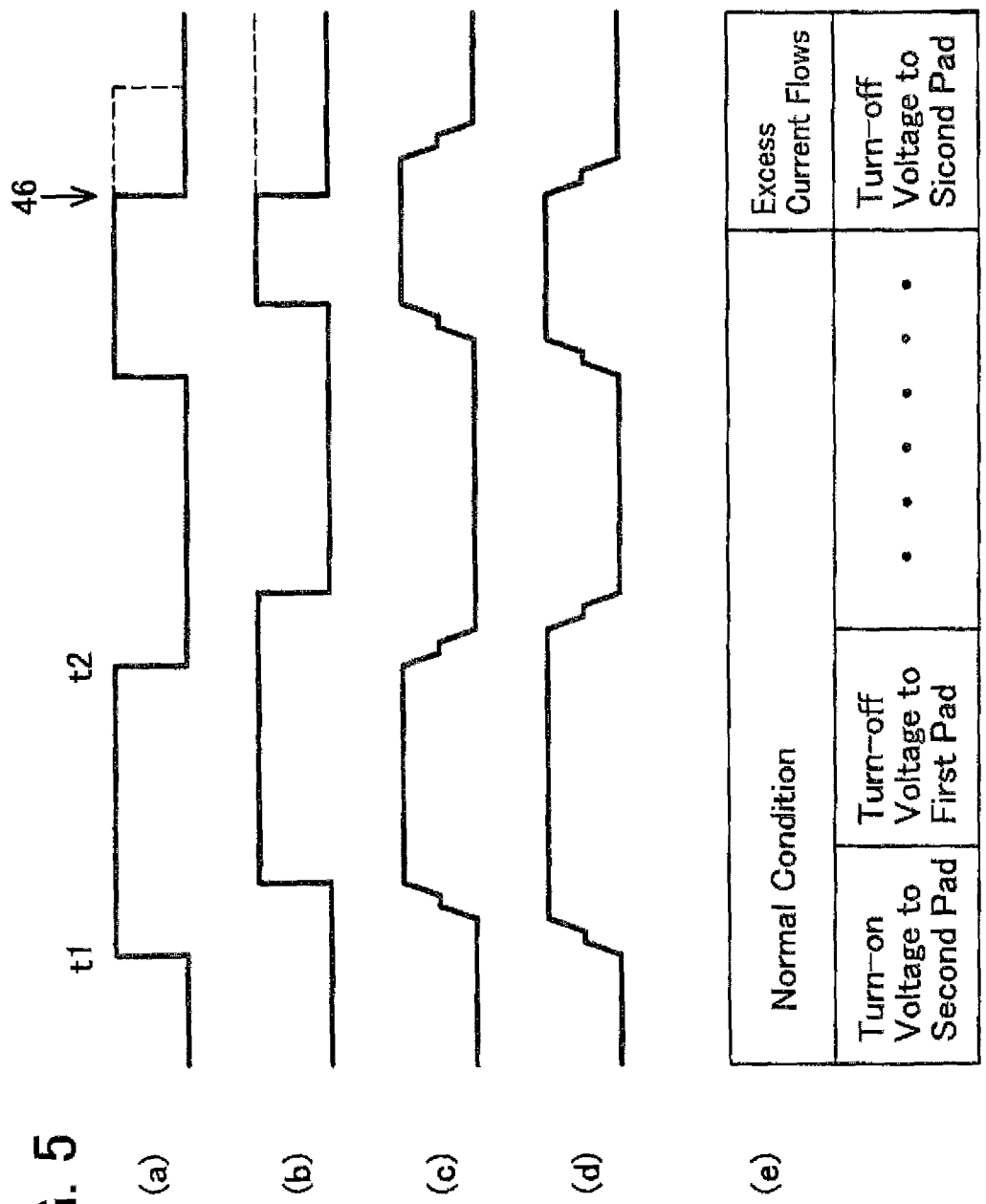
FIG. 5 is a diagram for describing a method of selecting the pads according to a second embodiment and resultant events.

FIG. 5(a) indicates example of input voltage to the terminal 2. FIG. 5(b) indicates input voltage to the terminal 20. An arrow 46 indicates an example moment when an excess current flows. As the comparison between (a) and (b) clearly shows, there is a relationship adjusted so that, during a time period in which no excess current is flowing, the second pad 26 is selected, with the first pad 22 left floating, before a timing t1 at which a turn-on signal is input. Additionally, there is a relationship adjusted so that the first pad 22 is selected, with the second pad 26 left floating, before a timing t2 at which a turn-off signal is input. Upon flowing of an excess current, as indicated at the position of the arrow 46, the voltage input to the terminal 2 becomes low, and the voltage input to the terminal 20 also becomes low. When an excess current flows, a turn-off signal is transmitted to the second pad 26. These relationships are summarized in (e).

The gate voltage at the IGBT cells formed in the central region of the substrate 32 is indicated by (c); the gate voltage at the IGBT cells formed in the peripheral region of the substrate 32 is indicated by (d). Since the turn-on voltage is transmitted to the second pad 26, the IGBT cells formed in the peripheral region are turned on early, and the IGBT cells formed in the central region are turned off with a delay. In contrast, since the turn-off voltage is transmitted to the first pad 22, the IGBT cells formed in the central region are turned off early, and the IGBT cells formed in the peripheral region are turned off with a delay. The embodiment provides the capability to suppress the heat produced in the central region and thereby to address the problem of the overheating in the central region.

Upon the detection of an excess current flowing through the semiconductor device 36, the terminal 2 receives the low voltage and the terminal 20 also receives the low voltage. As a result, the IGBT cells in the peripheral region are turned off early. The problem that the peripheral region is likely to overheat when an excess current flows can also be addressed.

Figure 6:
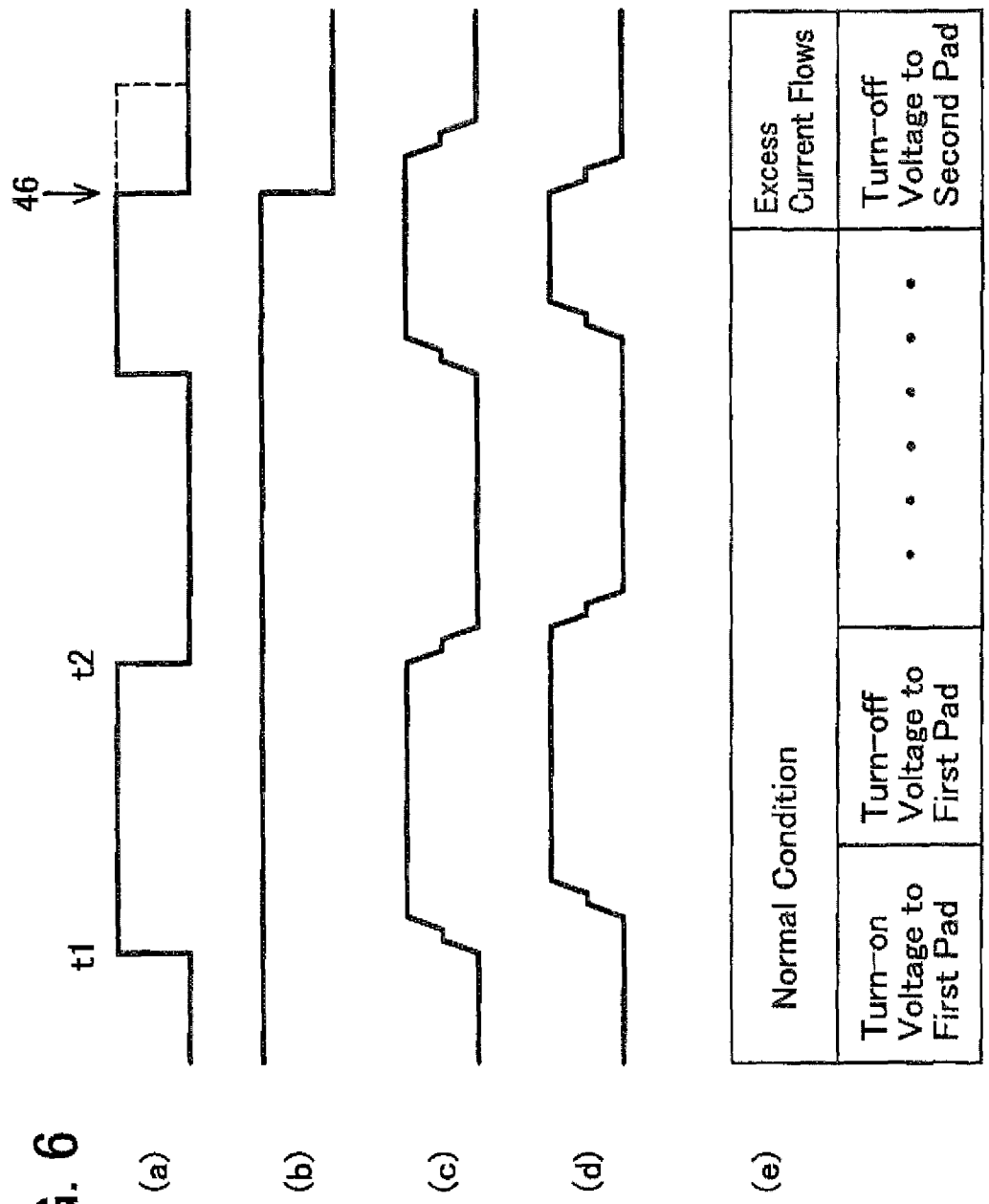
FIG. 6 is a diagram for describing a method of selecting the pads according to a third embodiment and resultant events.

FIG. 6(a) indicates example of input voltage to the terminal 2. FIG. 6(b) indicates input voltage to the terminal 20. An arrow 46 indicates an example moment when an excess current flows. As (b) clearly shows, there is a relationship adjusted so that, during a time period in which no excess current is flowing, the first pad 22 is selected, with the second pad 26 left floating. Upon flowing of an excess current, as indicated at the position of the arrow 46, the voltage input to the terminal 2 becomes low, and the voltage input to the terminal 20 also becomes low. When an excess current flows, a turn-off signal is transmitted to the second pad 26. These relationships are summarized in (e).

The gate voltage at the IGBT cells formed in the central region of the substrate 32 is indicated by (c); The gate voltage at the IGBT cells formed in the peripheral region of the substrate 32 is indicated by (d). Since both of the turn-on voltage and the turn-off voltage are transmitted to the first pad 22 during the time period in which no excess current is detected, the IGBT cells formed in the central region are turned on early and turned off early. In contrast, the IGBT cells formed in the peripheral region are turned on with a delay and turned off with a delay. The embodiment provides the capability to align the on-period in the central region with the on-period in the peripheral region.

Upon the detection of an excess current flowing through the semiconductor device 36, the terminal 2 receives the low voltage and the terminal 20 also receives the low voltage. As a result, the IGBT cells in the peripheral region are turned off early. The problem that the peripheral region is likely to overheat when an excess current flows can also be addressed.

In any of the embodiments described above, the fraction expressing the ratio of the time difference between the turn-on timings of different regions in the semiconductor device to one on-period, or the fraction expressing the ratio of the time difference between the turn-off timings to one off-period is small. The influence of the selection of the pads is small on an event the effect of which becomes evident when integrated over one on-period or one off-period. In contrast, the temperature rising phenomenon occurring when an excess current flows is fast; thus, the selection of the pads is effective in addressing the problem that the peripheral region is likely to overheat when an excess current flows, although the time difference between the turn-off timing advanced through the transmission of the turn-off voltage to the second pad and the turn-off timing resulting from the transmission of the turn-off voltage to the first pad is small.

Figure 7:
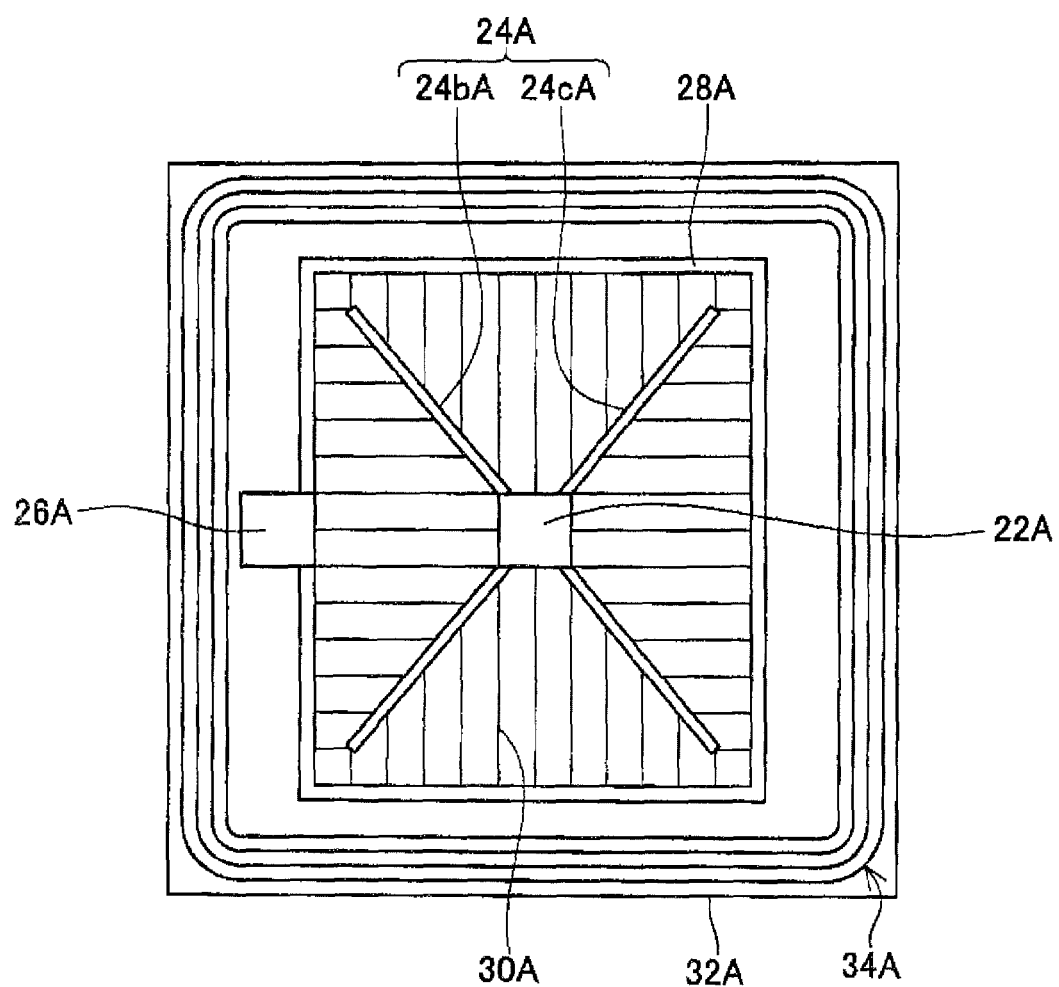
FIG. 7 is a schematic diagram illustrating a surface of a semiconductor substrate according to another embodiment.

FIG. 7 illustrates another embodiment including a first pad 22A, a second pad 26A, a first gate wiring 24A, a second gate wiring 28A, and a gate region 30A. With this semiconductor device, phenomena similar to those in the semiconductor device described above can also be obtained.

While the present invention has been described in detail with reference to some specific examples, they are intended for purposes of illustration only and are not intended to limit the scope of the claims. The techniques described in the scope of the claims include various changes and modifications of the specific examples described above.

Additionally, the technical elements described in the present application or in the drawings exert technical utility when used alone or in various combinations, and their use is not limited to the combination described in the claims at the time of application. Furthermore, the techniques described in the present application or in the drawings achieve more than one object simultaneously, and have technical utility in achieving one of the objects.

REFERENCE SIGNS LIST

1: Gate voltage adjusting device
2: Terminal

4: Transistor
6: Transistor
8: cMOS
10: On-resistor
12: Off-resistor
15: Pad selecting circuit
16: Transistor
18: Transistor
20: Terminal
22: First pad
24: First gate wiring
26: Second pad
28: Second gate wiring
30: Gate region
32: Substrate
34: Guard ring
36: Semiconductor device
38: Emitter electrode
40: Region where second points are distributed
42: Region where first points are distributed
44: Protective film
46: Excess current generation timing

The invention claimed is:

1. A semiconductor device comprising:
a substrate;
a first pad fixed on the substrate;
a first gate wiring connected to the first pad;
a second pad fixed on the substrate;
a second gate wiring connected to the second pad;
a plurality of gate regions, each of the gate regions extending on a surface of the substrate and being connected to the first gate wiring and the second gate wiring;
wherein each of the gate regions includes a first point connecting the gate region and the first gate wiring, and a second point connecting the gate region and the second gate wiring, and the first point and the second point are located at different positions on the surface of the substrate.

2. The semiconductor device of claim 1;
wherein the first point is located at a central region of the substrate, and the second point is located at a peripheral region of the substrate.

3. A combination of the semiconductor device of claim 1 and a gate voltage adjusting device;
wherein the gate voltage adjusting device comprises a switch applying a turn-on voltage to one of the first and second pads and applying a turn-off voltage to another pad.

4. A combination of the semiconductor device of claim 2 and a gate voltage adjusting device;
wherein the gate voltage adjusting device comprises a switch applying a turn-on voltage to one of the first and second pads and applying a turn-off voltage to another pad.

5. A combination of the semiconductor device of claim 1 and a gate voltage adjusting device;
wherein the gate voltage adjusting device applies a turn-on voltage to the first pad and applies a turn-off voltage to the second pad.

6. A combination of the semiconductor device of claim 1 and a gate voltage adjusting device;
wherein the gate voltage adjusting device comprises a switch changing one of the first pad and the second pad to which a turn-off voltage is applied when an excess current is detected.

7. A combination of the semiconductor device of claim 2 and a gate voltage adjusting device;
wherein the gate voltage adjusting device comprises a switch changing one of the first pad and the second pad to which a turn-off voltage is applied when an excess current is detected.

8. A combination of the semiconductor device of claim 2 and a gate voltage adjusting device;
wherein the gate voltage adjusting device applies a turn-off voltage to the first pad while an excess current is not detected and applies the turn-off voltage to the second pad when the excess current is detected.

9. A combination of the semiconductor device of claim 2 and a gate voltage adjusting device;
wherein the gate voltage adjusting device applies a turn-on voltage and a turn-off voltage to the first pad while an excess current is not detected and applies the turn-off voltage to the second pad when the excess current is detected.

10. A combination of the semiconductor device of claim 2 and a gate voltage adjusting device;
wherein the gate voltage adjusting device applies a turn-on voltage to the second pad and applies a turn-off voltage to the first pad while an excess current is not detected and applies the turn-off voltage to the second pad when the excess current is detected.

* * * * *